United States Patent [19]

Pfleiderer et al.

[11] 4,349,749
[45] Sep. 14, 1982

[54] INTEGRATED CIRCUIT FOR TRANSFERRING COMPLEMENTARY CHARGE PACKETS BETWEEN TWO CHARGE TRANSFER DEVICES

[75] Inventors: Hans-Joerg Pfleiderer, Zorneding; Heiner Klar, Munich, both of Fed. Rep. of Germany

[73] Assignee: Siemens Aktiengesellschaft, Berlin & Munich, Fed. Rep. of Germany

[21] Appl. No.: 168,650

[22] Filed: Jul. 11, 1980

[30] Foreign Application Priority Data

Sep. 11, 1979 [DE] Fed. Rep. of Germany ....... 2936731

[51] Int. Cl.$^3$ ...................... G11C 19/28; H01L 29/78
[52] U.S. Cl. ................................. 307/221 D; 357/24
[58] Field of Search .................. 307/221 D; 357/24 R

[56] References Cited

U.S. PATENT DOCUMENTS

| 3,867,645 | 2/1975 | Weimer | 307/221 D |
| 4,040,077 | 8/1977 | Tehon | 307/221 D |
| 4,099,197 | 7/1978 | Ibrahim et al. | 357/24 R |
| 4,210,825 | 7/1980 | Crochiere et al. | 307/221 D |

OTHER PUBLICATIONS

Sequin et al., *Charge Transfer Devices*, Academic Press, N.Y., 1975, pp. 52-59.
Sealer et al., "A Dual Differential Charge-Coupled Analog Delay Device", IEEE J. Solid-State Circuits, vol. 5C-11 (2/76), pp. 105-108.

*Primary Examiner*—Gene M. Munson
*Attorney, Agent, or Firm*—Hill, Van Santen, Steadman, Chiara & Simpson

[57] ABSTRACT

An integrated circuit for transferring complementary charge packets between a first and second charge transfer device has a resettable gate common to both charge transfer devices which serves as a transfer electrode for the first charge transfer device and as an electrode in the input stage of the second charge transfer device. An electrode which is maintained at a constant voltage is disposed in the second charge transfer device between the common electrode and an oppositely doped semiconductor region which is connected to a normally constant voltage which periodically is substantially reduced, thereby flooding the region beneath the common electrode with charge carriers. When the voltage connected to the oppositely doped semiconductor region is returned to a high value, a potential well is created beneath the constant voltage electrode which becomes filled with a first charge packet. Upon the appearance of the charge packet in the first transfer device beneath the common electrode, a voltage drop occurs which results in a corresponding potential drop beneath the common gate in the second charge transfer device resulting in a flow of charge carriers in reverse to the previous flow leaving a charge packet beneath the common gate which is complementary to the charge packet introduced into the first charge transfer device.

3 Claims, 4 Drawing Figures

INTEGRATED CIRCUIT FOR TRANSFERRING COMPLEMENTARY CHARGE PACKETS BETWEEN TWO CHARGE TRANSFER DEVICES

BACKGROUND OF THE INVENTION

1. Field of the Invention

The present invention relates to integrated circuits having two charge transfer devices, and in particular to such circuits permitting the transfer of complementary charge packets between the charge transfer devices.

2. Description of the Prior Art

Integrated circuits are known in the art which include two or more charge transfer devices among which charge packets may be transferred in the form of complementary charge packets. The charge packets may correspond to analog or digital signal values. Such known circuits operate by deriving a voltage signal from an arriving charge packet in a charge transfer device output stage, inverting the signal and supplying the inverted signal to the input stage of a second charge transfer device which then derives a complementary charge packet from the inverted voltage signal. Such circuits require substantial expense and relatively large semiconductor surfaces, thereby limiting the utility of such circuits.

Basic charge transfer device arrangements and a description of the operation thereof which have application to the present invention are described, for example, in the text "Charge Transfer Devices", by Sequin and Tompsett, Academic Press, New York, 1975 at pages 1 through 18.

SUMMARY OF THE INVENTION

It is an object of the present invention to provide an integrated circuit for the transfer of complementary charge packets between two charge transfer devices which occupies a relatively small semiconductor surface area and is economical to manufacture.

The above object is inventively achieved in an integrated circuit utilizing a common gate electrode which is disposed above the transfer channels of two charge transfer devices. The common gate electrode serves as a transfer electrode for the first charge transfer device and forms a part of the input stage of the second charge transfer device. The common gate electrode is connected through a switching transistor to a constant voltage source, with the switching transistor being controlled by a clock pulse voltage.

The second charge transfer device has an oppositely doped semiconductor region connected to a first voltage which is followed in the direction of charge transfer by an electrode which is maintained at a constant voltage which is in turn followed by the common gate electrode. The oppositely doped semiconductor region, the constant voltage electrode, and the portion of the common gate electrode extending over the transfer channel of the second charge transfer device form the input stage for the second charge transfer device. The first voltage connected to the oppositely doped region in the second charge transfer device is periodically substantially reduced, which reduction is preceded by a connection of the common gate electrode to the reference potential, so that when the reduction occurs the semiconductor zone beneath the constant voltage electrode and the portion of the common gate electrode over the second charge transfer device transfer channel becomes flooded with charge carriers. Upon the subsequent return of the first voltage connected to the oppositely doped semiconductor region to its initial value, a potential well beneath the portion of the common gate electrode above the second charge transfer device transfer channel remains filled with charge carriers forming a first charge packet.

Upon the appearance of the charge packet in the first charge transfer device beneath the common gate electrode in the first charge transfer device, a voltage drop from the reference potential occurs resulting in a potential drop beneath the portion of the gate electrode above the second charge transfer device transfer channel which results in a displacement of charge carriers in the opposite direction in the second charge transfer device back toward the oppositely doped region. A charge packet thereby remains beneath the common gate electrode in the second charge transfer device transfer channel which is complementary to the charge packet in the first charge transfer device which is a result of the difference between the magnitude of the first charge packet formed and the charge packet now remaining in the first charge transfer device. The charge packets are subsequently transferred in each transfer channel on an electrode-by-electrode basis as is known in the art.

DESCRIPTION OF THE PREFERRED EMBODIMENTS

Figure 1:
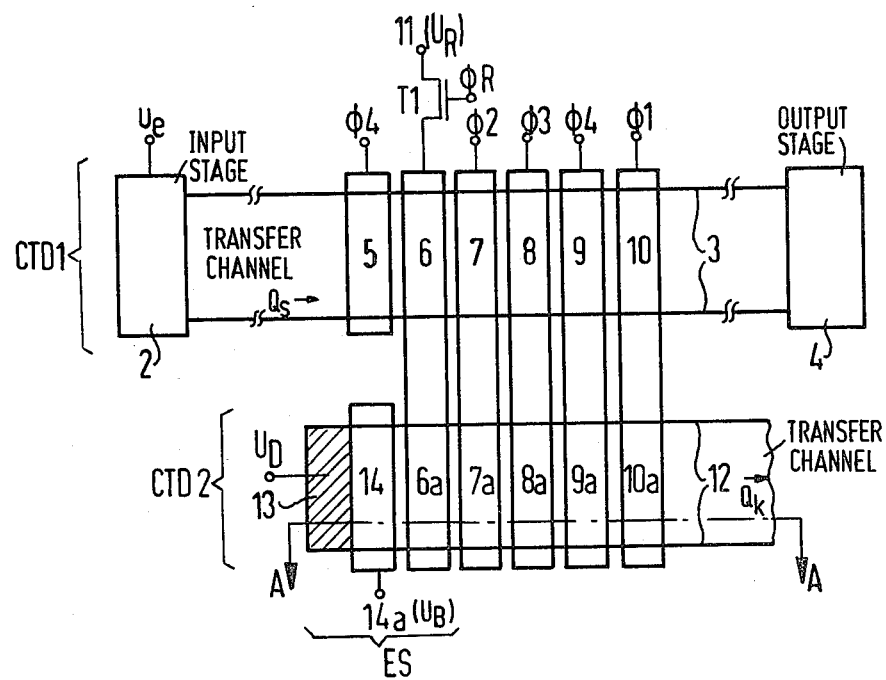
FIG. 1 is a schematic circuit diagram of an integrated circuit with two charge transfer devices for transfer of complementary charge packets between the charge transfer devices constructed in accordance with the principles of the present invention.

A schematic circuit diagram for an integrated circuit having two charge transfer devices CTD1 and CTD2 is shown in FIG. 1. The first charge transfer device CTD1 has an input stage 2, a transfer channel 3 and an output stage 4. The second charge transfer device CTD2 has an input stage ES, a transfer channel 12, and an output stage (not shown).

Figure 2:
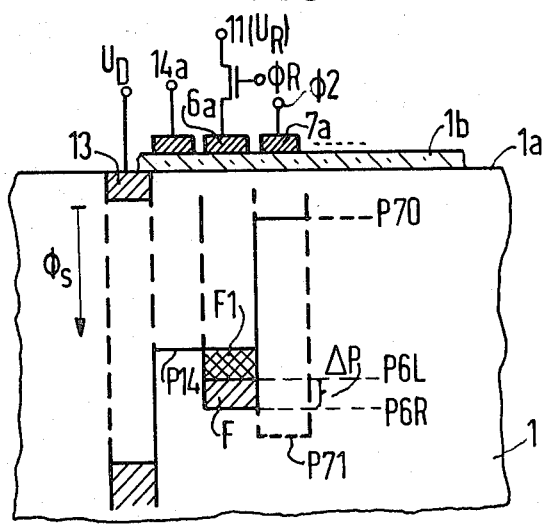
FIG. 2 is a sectional view taken along line A—A of FIG. 1.

The charge transfer devices are arranged on a semiconductor substrate 1, as shown in FIG. 2, which may consist, for example, of p-conductive silicon. Each charge transfer device has a plurality of electrodes which are disposed above the semiconductor body 1 on a thin electrically insulating layer 1b which is disposed on the boundary 1a of the semiconductor body 1. The insulating layer 1b may consist, for example, of silicon dioxide and covers the semiconductor body 1 in a thin film region (gate oxide region) within the areas designated as the transfer channels 3 and 12, and has a thick film region (field oxide region) beyond those channels.

A portion of the electrodes associated with the first charge transfer device CTD1 are shown in FIG. 1 and numbered 5, 6, 7, 8, 9 and 10. Electrodes 6 through 10 further extend above the transfer channel 12 of the second charge transfer device CTD2, with those portions being designated as 6a, 7a, 8a, 9a and 10a. It will be understood that each charge transfer device exhibits many more electrodes which are omitted for simplicity. A further electrode 5 is allocated only to the first charge transfer device CTD1 and is connected to a clock pulse voltage $\phi 4$. An electrode 14 is allocated only to the second charge transfer device CTD2 and has a terminal 14a which is connected to a constant voltage $U_B$. The electrodes 7 and 7a are connected to a clock pulse voltage $\phi 2$, the electrodes 8 and 8a are connected to a clock pulse voltage $\phi 3$, the electrodes 9 and 9a are connected to a clock pulse voltage $\phi 4$, and the electrodes 10 and 10a are connected to a clock pulse voltage $\phi 1$.

The gate electrode 6 and 6a is connected at a terminal 11 to a reference potential $U_R$ through a switching transistor T1. The switching transistor has a gate or control electrode connected to a clock pulse voltage $\phi R$, making the electrode 6 and 6a a resettable gate.

The second charge transfer device has a semiconductor region 13 having a conductivity opposite to that of the semiconductor body 1 which is disposed adjacent to the electrode 14. The region 13, the electrode 14 and the electrode 6a together form the input stage ES of the second charge transfer device CTD2. The gates 6 and 6a may, as shown in FIG. 1, simply be an extension of a single gate covering portions of both transfer channels 3 and 12, or may consist of separate conductive coatings which are not combined but which are interconnected by a conductor path. The transfer electrodes 7a through 10a are formed by extensions of the electrodes 7 through 10.

Operation of the circuit shown in FIG. 1 will be made with reference to the voltage/time diagram shown in FIG. 3 and the potential diagram shown in FIG. 2 representing $\phi_s$.

Figure 3:
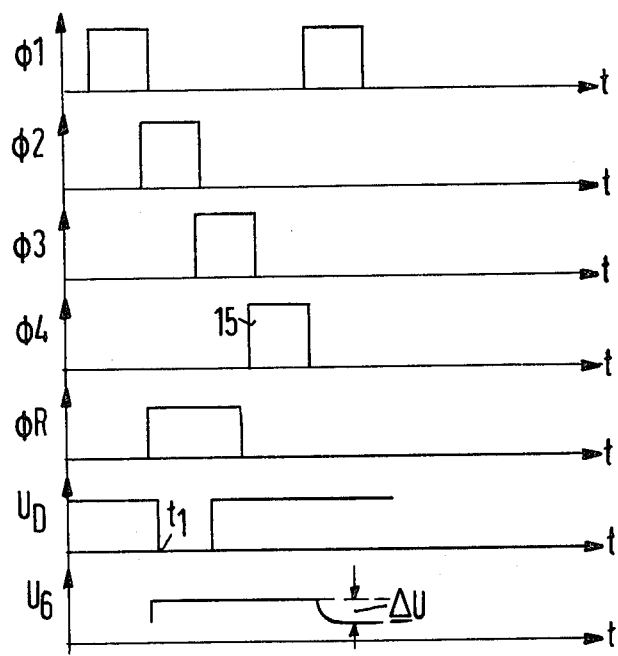
FIG. 3 is a voltage/time diagram for the various voltages shown in FIGS. 1 and 2 for the operation thereof.

A charge packet $Q_s$ which is generated by an input signal $u_e$ supplied to the input stage 2 is entered into the transfer channel 3 of the first charge transfer device CTD1 and is transferred in the direction toward the output stage 4 by the sequence of clock pulse voltages $\phi 1$ through $\phi 4$ as shown in FIG. 3. Before the charge packet $Q_s$ arrives beneath the electrode 5, a pulse $\phi R$ occurs rendering the transistor T1 conductive and setting the common gate electrodes 6 and 6a at the reference potential $U_R$. A potential P6R thereby occurs at the boundary surface 1a beneath the electrode 6. A constant surface potential P14 exists beneath the gate 14 in the second charge transfer device CTD2 as a result of the voltage $U_B$.

At a time t1, the first voltage $U_D$ connected to the region 13 is greatly reduced so that the semiconductor zone beneath the electrodes 14 and 6a is flooded with charge carriers from the region 13. Upon the return of the voltage $U_D$ to its original value, the potential well P6R beneath the electrode 6a and between the potential threshholds P14 and P70 is filled with a charge packet $Q_o$. The charge packet $Q_o$ corresponds to the combination of the singly shaded area F and the cross-shaded area F1 in FIG. 2. At this time, the gate 6 is at the voltage $U_R$. Upon the trailing edge 15 of the clock pulse $\phi 4$, the charge packet $Q_s$ from the input stage 2 now arrives beneath the gate 6 and results in a voltage drop $\Delta U$ which produces a corresponding potential drop $\Delta P$ below the electrode 6a to P6L. This in turn effects a displacement of the charge carriers represented at F in the opposite direction back toward the oppositely doped region 13. A charge packet $Q_K$ thus remains beneath the electrode 6a, with the charge packet $Q_K$ corresponding to the area F1. This charge packet is complementary to the charge packet $Q_s$ from the input stage 2 because it corresponds to the relationship $Q_K = Q_o - Q_s$. As a result of the following clock pulse $\phi 2$ and the further clock pulses, the charge packets $Q_s$ are transported in the direction of the arrow along the transfer channel 3 in the device CTD1 and the corresponding complementary charge packets $Q_K$ are transferred in the direction of the arrow in the second device CTD2.

As a result of the fixed potential threshhold P14 which determines the size of the charge packet $Q_K$, the depletion capacitances between the portions 6 and 6a of the common gate electrode cannot effect the linearity of the conversion of $Q_s$ to $Q_K$.

Figure 4:
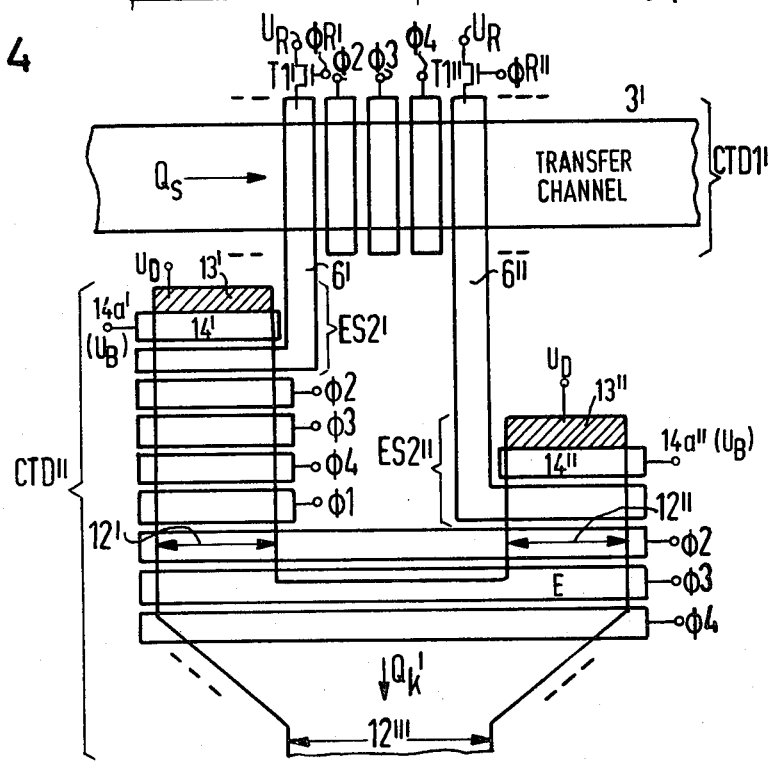
FIG. 4 is a schematic circuit diagram of a second embodiment of the circuit of FIG. 1 for generating an amplified complimentary charge packet.

A second embodiment of the circuit is shown in FIG. 4 which effects the amplification of the complimentary charge packet and results in a complementary charge packet $Q'_K$ which is approximately twice the magnitude of the packet $Q_K$ generated in FIG. 1. As shown in FIG. 4, a first charge transfer device CTD1' has a transfer channel 3' and is used to transfer a charge packet $Q_s$. The device CTD1' has a pair of common gate electrodes 6' and 6" which respectively extend over transfer channels 12' and 12" of a second charge transfer device CTD". A combined transfer channel 12''' is derived from the combination of the channels 12' and 12". The transfer channel 12' has an input stage ES2' which operates in an identical manner to the input stage ES and is referenced with correspondingly single primed reference numerals. The transfer channel 12" has an input stage ES2" which also operates in an identical manner to the input stage ES shown in FIG. 1, and which has correspondingly double-primed reference numerals. The input stages ES2' and ES2" are offset by a transfer stage of CTD". By a transfer stage is meant a series of successive electrodes operated by the total number of clock pulse voltages.

The common gate electrode 6' is connected to a reference potential $U_R$ through a switching transistor T1' connected at its gate electrode to a clock pulse voltage $\phi R'$, while the other common gate electrode 6" is connected to the reference potential $U_R$ through a switching transistor T1" having a gate electrode connected to a clock pulse voltage $\phi R''$. The reset pulses $\phi R'$ and $\phi R''$ are chronologically separated by a time corresponding to a clock period of $\phi 1$.

The transfer channels 12' and 12" are united to form the common channel 12''' beneath a transfer electrode E of the device CTD". As a result of the complementary charges being formed in the respective channels 12' and 12" in the same manner as described in connection with FIG. 1, the resulting charge packet $Q'_K$ will be approximately double the magnitude of the charge packet $Q_K$ generated in the embodiment of FIG. 1. Moreover, the combined transfer channel 12''' extends generally perpendicularly to the transfer channel 3' which may have particular utility in certain spatial limitations.

It will be understood that the concept shown in FIG. 4 may be extended such that any number of input stages corresponding to ES2' and ES2" can be provided which are connected at their resettable gates to a corresponding number of transfer stages of the device CTD1'.

Although the above embodiments were described utilizing charge transfer device arrangements designated as surface charge coupled devices (SCCD) the inventive concept described herein can be undertaken with any known CTD arrangement, and such CTD arrangements may operate in a two, three, four or multiphase mode of operation.

Although modifications and changes may be suggested by those skilled in the art, it is the intention of the inventors to embody within the patent warranted hereon all changes and modifications as reasonably and properly come within the scope of their contribution to the art.

We claim as our invention:

1. In a circuit integrated on a doped semiconductor body having first and second charge transfer devices each having a transfer channel in which charge packets are transferred by clock pulse voltages respectively applied to successive electrodes disposed above said transfer channels, an improvement for generating a charge packet in said second charge transfer device which is complementary to a charge packet in said first charge transfer device comprising:

a switching transistor connected to a reference voltage source and having a control input connected to a pulsed reset voltage;

at least one resettable gate electrode disposed above each said transfer channel and separated from said semiconductor body by an electrically insulating layer, each said resettable gate being connected to said reference voltage source through said switching transistor with pairs of said resettable gates respectively disposed above each said transfer channel being electrically connected, and said resettable gate electrode disposed above the transfer channel of said second charge transfer device forming a final electrode in an input stage for said second charge transfer device, said input stage generating a plurality of charge packets of constant size, whereby the appearance of a charge packet beneath said resettable gate electrode in said first charge transfer device decreases the potential beneath the resettable gate electrode above said second charge transfer device such that a potential well is formed which is filled with charge carriers forming a complementary charge packet in said second charge transfer device.

2. The circuit of claim 1 wherein said transfer channels are disposed parallel to each other and wherein said electrodes are electrically conducting strips disposed on said insulating layer and commonly extending over a portion of each of said transfer channels, and wherein said resettable gate electrodes are portions of a common strip electrode disposed above both of said transfer channels.

3. The circuit of claim 1 wherein the number of said resettable gate electrodes is two or more and wherein said second charge transfer device has a plurality of transfer channels each having an input stage including said resettable gate electrode, and wherein said plurality of transfer channels in said second charge transfer device are united after said resettable gate electrodes to form a common transfer channel, whereby a charge packet transferred in said common transfer channel is the sum of the charge packets in the plurality of transfer channels.

* * * * *